(12) United States Patent
Roig-Guitart et al.

(10) Patent No.: US 11,444,090 B2
(45) Date of Patent: Sep. 13, 2022

(54) SEMICONDUCTOR DEVICE HAVING A PROGRAMMING ELEMENT

(71) Applicant: SEMICONDUCTOR COMPONENTS INDUSTRIES, LLC, Phoenix, AZ (US)

(72) Inventors: Jaume Roig-Guitart, Oudenaarde (BE); Aurore Constant, Oudenaarde (BE)

(73) Assignee: SEMICONDUCTOR COMPONENTS INDUSTRIES, LLC, Phoenix, AZ (US)

( * ) Notice: Subject to any disclaimer, the term of this patent is extended or adjusted under 35 U.S.C. 154(b) by 116 days.

(21) Appl. No.: 16/853,613

(22) Filed: Apr. 20, 2020

(65) Prior Publication Data

US 2021/0327886 A1   Oct. 21, 2021

(51) Int. Cl.
| | | |
|---|---|---|
| *H01L 27/112* | (2006.01) | |
| *H01L 29/20* | (2006.01) | |
| *H01L 29/06* | (2006.01) | |
| *H01L 29/778* | (2006.01) | |
| *H01L 29/66* | (2006.01) | |
| *H01L 29/868* | (2006.01) | |
| *H01L 21/306* | (2006.01) | |
| *H01L 29/205* | (2006.01) | |
| *H01L 29/30* | (2006.01) | |

(52) U.S. Cl.
CPC .. *H01L 27/11206* (2013.01); *H01L 21/30612* (2013.01); *H01L 29/0657* (2013.01); *H01L 29/2003* (2013.01); *H01L 29/205* (2013.01); *H01L 29/30* (2013.01); *H01L 29/66219* (2013.01); *H01L 29/66462* (2013.01); *H01L 29/7786* (2013.01); *H01L 29/868* (2013.01)

(58) Field of Classification Search
CPC ......... H01L 27/11206; H01L 21/30612; H01L 29/0657; H01L 29/2003; H01L 29/205; H01L 29/30; H01L 29/66219; H01L 29/66462; H01L 29/7786; H01L 29/868; H01L 29/0684; H01L 29/0843; H01L 29/1066
See application file for complete search history.

(56) References Cited

U.S. PATENT DOCUMENTS 10,644,128 B1 * 5/2020 Chen ................. H01L 21/76832
2015/0028384 A1   1/2015 Cao et al.
(Continued)

OTHER PUBLICATIONS

I. P. Smorchkova, AlN/GaN and (Al,Ga)N/AlN/GaN twodimensional electron gas structures grown by plasma-assisted molecular-beam epitaxy, Oct. 31, 2001, Journal of Applied Physics, 90, 5196-5201 (Year: 2001).*

(Continued)

*Primary Examiner* — Nilufa Rahim
(74) *Attorney, Agent, or Firm* — Robert F. Hightower

(57) ABSTRACT

An embodiment of a method of forming a programming element using a III/V semiconductor material may include forming one or more recesses in a first portion of a gate material and forming a first conductor on the one or more recesses.

In an embodiment, the method may include configuring a programming circuit to form a voltage across the one or more recesses that is greater than a breakdown voltage of the gate material underlying the one or more recesses.

20 Claims, 4 Drawing Sheets

(56) References Cited

U.S. PATENT DOCUMENTS

| | | | |
|---|---|---|---|
| 2018/0240791 A1 | 8/2018 | Jeon | |
| 2019/0096879 A1* | 3/2019 | Chen | H01L 27/0629 |
| 2019/0267482 A1* | 8/2019 | Udrea | H01L 29/205 |
| 2020/0013774 A1* | 1/2020 | Lin | H01L 27/0605 |
| 2020/0105744 A1* | 4/2020 | Dasgupta | H01L 27/0629 |
| 2020/0287033 A1* | 9/2020 | Suh | H01L 29/778 |
| 2020/0328296 A1* | 10/2020 | Hwang | H01L 27/0883 |
| 2020/0350427 A1* | 11/2020 | Jiang | H01L 29/66462 |
| 2021/0043750 A1* | 2/2021 | Neufeld | H01L 29/2003 |
| 2021/0335781 A1* | 10/2021 | Arnold | H01L 27/0738 |

OTHER PUBLICATIONS

Donald T. Comer et al., "Zener Zap Anti-Fuse Trim in VLSI Circuits," VLSI Design, vol. 5, No. 1, pp. 89-100, 1995, 12 pages.

Elodie Ebrard et al., "Review of fuse and antifuse solutions for advanced standard CMOS technologies," Microelectron.J(2009),doi:10.1016/j.mejo.2009.09.007.

J. Teichmann et al., "One Time Programming (OTP) with Zener Diodes in CMOS Processes," ESSDERC '03. 33rd Conference on European Solid-State Device Research, 2003., Estoril, Portugal, 2003, pp. 433-436.

Tina He et al., "Silicon Carbide (SiC) Nanoelectromechanical Antifuse for Ultralow-Power One-Time-Programmable (OTP) FPGA Interconnects," Journal of the Electron Devices Society, vol. 3, No. 4, Jul. 2015, pp. 323-335.

\* cited by examiner

SEMICONDUCTOR DEVICE HAVING A PROGRAMMING ELEMENT

BACKGROUND

The present invention relates, in general, to electronics, and more particularly, to semiconductors, structures thereof, and methods of forming semiconductor devices.

In the past, various methods and structures were utilized to form one time programmable (OTP) elements that can be used to indicate a certain state, such as for example a logical high state or a logical low state. These OTP elements were often formed in silicon technology from materials such as polysilicon which sometimes included either a silicide or salacide. In some configurations, a metal may have been used. The material generally was programed to form an open circuit to indicate that the element had been programmed to represent the certain state.

Although these OTP elements were commonly formed in silicon technologies, there were no corresponding OTP elements for technologies that were formed using group III or V materials, such as for example gallium nitride materials.

Accordingly, it is desirable to have a method and structure for forming an OTP element that uses group III or V materials or alternately that uses gallium nitride materials.

Figure 1:
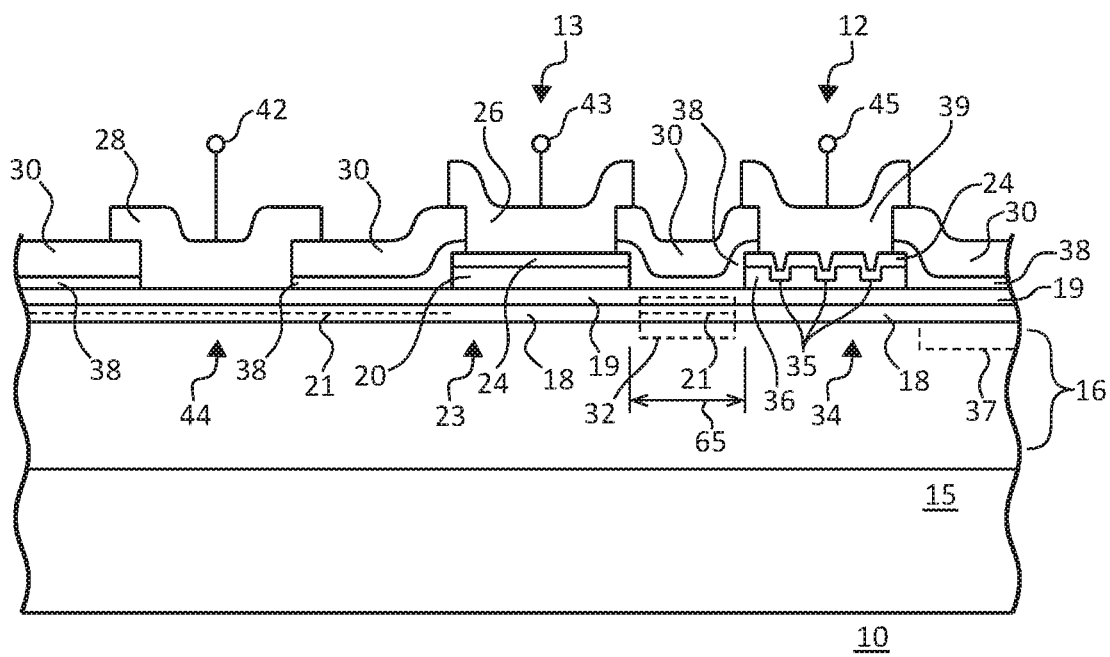
FIG. 1 illustrates an enlarged cross-sectional portion of an example of an embodiment of a semiconductor device that includes an OTP device formed in accordance with the present invention.

For simplicity and clarity of the illustration(s), elements in the figures are not necessarily to scale, some of the elements may be exaggerated for illustrative purposes, and the same reference numbers in different figures denote the same elements, unless stated otherwise. Additionally, descriptions and details of well-known steps and elements may be omitted for simplicity of the description. As used herein current carrying element or current carrying electrode means an element of a device that carries current through the device such as a source or a drain of a transistor such as an MOS transistor or a high electron mobility transistor (HEMI), or an emitter or a collector of a bipolar transistor, or a cathode or anode of a diode, and a control element or control electrode means an element of the device that controls current through the device such as a gate of an MOS transistor, a gate of a HEMI, or a base of a bipolar transistor. Additionally, one current carrying element may carry current in one direction through a device, such as carry current entering the device, and a second current carrying element may carry current in an opposite direction through the device, such as carry current leaving the device. Although the devices may be explained herein as certain N-channel or P-channel devices, or certain N-type or P-type doped regions, a person of ordinary skill in the art will appreciate that complementary devices are also possible in accordance with the present invention. One of ordinary skill in the art understands that the conductivity type refers to the mechanism through which conduction occurs such as through conduction of holes or electrons, therefore, that conductivity type does not refer to the doping concentration but the doping type, such as P-type or N-type. It will be appreciated by those skilled in the art that the words during, while, and when as used herein relating to circuit operation are not exact terms that mean an action takes place instantly upon an initiating action but that there may be some small but reasonable delay(s), such as various propagation delays, between the reaction that is initiated by the initial action. Additionally, the term while means that a certain action occurs at least within some portion of a duration of the initiating action. The use of the word approximately or substantially means that a value of an element has a parameter that is expected to be close to a stated value or position. However, as is well known in the art there are always minor variances that prevent the values or positions from being exactly as stated. It is well established in the art that variances of up to at least ten percent (10%) (and up to twenty percent (20%) for some elements including semiconductor doping concentrations) are reasonable variances from the ideal goal of exactly as described. When used in reference to a state of a signal, the term "asserted" means an active state of the signal and the term "negated" means an inactive state of the signal. The actual voltage value or logic state (such as a "1" or a "0") of the signal depends on whether positive or negative logic is used. Thus, asserted can be either a high voltage or a high logic or a low voltage or low logic depending on whether positive or negative logic is used and negated may be either a low voltage or low state or a high voltage or high logic depending on whether positive or negative logic is used. Herein, a positive logic convention is used, but those skilled in the art understand that a negative logic convention could also be used. The terms first, second, third and the like in the claims or/and in the Detailed Description of the Drawings, as used in a portion of a name of an element are used for distinguishing between similar elements and not necessarily for describing a sequence, either temporally, spatially, in ranking or in any other manner. It is to be understood that the terms so used are interchangeable under appropriate circumstances and that the embodiments described herein are capable of operation in other sequences than described or illustrated herein. Reference to "one embodiment" or "an embodiment" means that a particular feature, structure or characteristic described in connection with the embodiment is included in at least one embodiment of the present invention. Thus, appearances of the phrases "in one embodiment" or "in an embodiment" in various places throughout this specification are not necessarily all referring to the same embodiment, but in some cases it may. Furthermore, the particular features, structures or characteristics may be combined in any suitable manner, as would be apparent to one of ordinary skill in the art, in one or more embodiments. For clarity of the drawings, doped regions of device structures are illustrated as having generally straight line edges and precise angular corners. However, those skilled in the art understand that due to the diffusion and activation of dopants the edges of doped regions generally may not be straight lines and the corners may not be precise angles.

In addition, the description illustrates a cellular design (where the body regions are a plurality of cellular regions) instead of a single body design (where the body region is comprised of a single region formed in an elongated pattern, in some embodiments in a serpentine pattern). However, it is intended that the description is applicable to both a cellular implementation and a single base implementation.

The embodiments illustrated and described hereinafter may have embodiments and/or may be practiced in the absence of any element which is not specifically disclosed herein.

DETAILED DESCRIPTION

Figure 2:
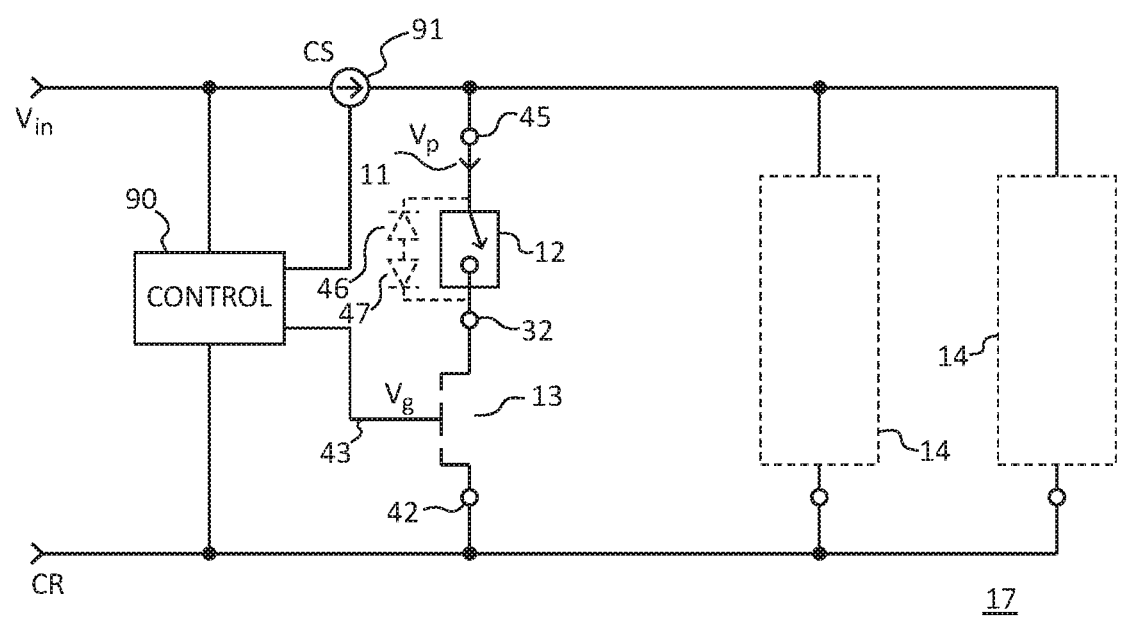
FIG. 2 schematically illustrates an example of an embodiment of a portion of a programming circuit in accordance with the present invention.

FIG. 1 illustrates an enlarged cross-sectional portion of an example of an embodiment of a semiconductor device 10 that includes an OTP device formed using group III or V materials. An embodiment of device 10 includes GaN. An embodiment of the OTP device may include a programmable device 12. An embodiment of device 10 may also include a selection transistor 13 that may be used to assist in programming a particular state or condition into device 12. In an embodiment, transistor 13 may be an enhancement mode high electron mobility transistor (eHEMT). Those skilled in the art will appreciate that transistor 13 may be other types of transistors in other embodiments, such as for example an MOS transistor, a depletion mode HEMT, or other types of transistors. An embodiment of device 12 may include a structure that is similar to at least a portion of a gate structure of the HEMT embodiment of transistor 13. Device 12 may have an embodiment that may be formed to include an input terminal 45. Device 12 also includes a node 32 through which a current 11 can flow from device 12 to another device, such as for example to transistor 13. As will be seen further hereinafter, an embodiment of device 10 may include that node 32 is formed coextensively with a portion of the drain of transistor 13. Thus, an embodiment may include that node 32 is a node within a layer of device 10, such as for example at the drain of transistor 13. As will be seen further hereinafter, an embodiment of device 12 may include an isolation structure to assist in forming device 12 to have an unprogrammed functional embodiment of a pair of back-to-back diodes (FIG. 2). For example, the isolation structure may isolate device 12 so that current 11 will flow through device 12 from element 34 to node 32, or alternately from terminal 45 to node 32.

FIG. 2 schematically illustrates an example of an embodiment of a portion of a programming circuit 17. An embodiment of circuit 17 may include a plurality of circuits 14. Any one of circuits 14 may have an embodiment that is representative of a circuit embodiment of at least device 12. An embodiment of circuit 14 may also include transistor 13. Circuit 17 may have an embodiment that includes a current source 91 that selectively provides a programming voltage (Vp) to each of the plurality of circuits 14. Circuit 17 may also include a control circuit 90.

Circuit 14 includes a representation of a schematic illustration of an embodiment of device 12 and alternately of transistor 13. An embodiment of device 12 may be viewed as a switch that is open in an unprogrammed condition, or that is substantially closed in a programed condition. Alternately, device 12 may be viewed to function as a pair of back-to-back diodes 46 and 47 (see dashed lines) in the unprogrammed condition. For example, diodes having commonly connected anodes. In the programmed condition, device 12 may be viewed as a conduction path. An embodiment of the conduction path of the programmed condition may include a diode, such as for example diode 46, so that forward biasing the diode allows a current 11 to flow. An embodiment of device 10 may include that device 12 is connected in series with transistor 13. During programming and after programming, device 12 is configured to conduct current 11. In the unprogrammed condition, current 11 is substantially zero as long as the voltage applied to device 12 is less than the breakdown voltage of device 12. Those skilled in the art will appreciate that the unprogrammed condition of device 12 may have some very minor unprogrammed leakage current through it, but this unprogrammed leakage current is no greater than the gate-to-source leakage current of an eHEMT, such as for example the HEMT embodiment of transistor 13. Thus, an embodiment of transistor 13 may be configured to assist in forming the programmed condition of device 12. Additionally, device 12 may also be left in an unprogrammed condition to represent an open state or open condition wherein current 11 substantially does not flow through device 12.

Terminal 45 of device 12 may have an embodiment that may be configured to be connected to source 91. Thus, device 12 may be configured to receive the programming voltage Vp at terminal 45. Terminal 45 may also conduct current 11 to flow through device 12 in the programmed condition or alternately during the operation of programming device 12. In an embodiment, a terminal 42 of circuit 14 may be connected to a common return (CR) voltage for circuit 14 or circuit 17. For example, terminal 42 may be connected to a common ground potential or to another common potential that is used to return current to a power supply that supplies power to circuit 17.

Figure 3:
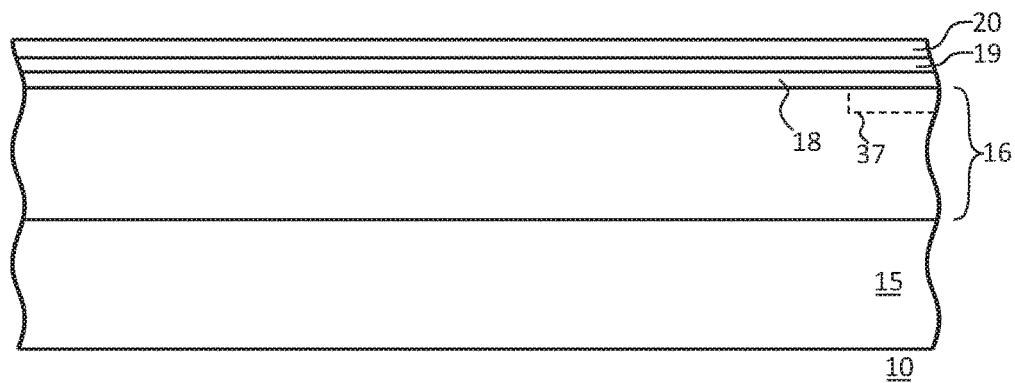
FIG. 3 illustrates an enlarged cross-sectional portion of an example of an embodiment the device of FIG. 1 at an early stage in an example of an embodiment of a method of forming the device in accordance with the present invention.

FIG. 3 illustrates an enlarged cross-sectional portion of an example of an embodiment of device 12 or alternately device 10 at an early stage in an example of an embodiment of a method of forming device 12. Device 12 or alternately device 10 is formed on a substrate 15. In an embodiment, circuit 17 (FIG. 2) may be formed on substrate 15 along with device 10. An embodiment of substrate 15 may be a silicon substrate that is used for supporting other portions of device 10. Substrate 15 may also be other materials such as sapphire, silicon carbide, aluminum nitride, or other materials. A buffer layer 16 may be formed on substrate 15. Those skilled in the art will appreciate that layer 16 may be a plurality of layers that assist in distributing and minimizing physical stresses between the materials of substrate 15 and the materials on layer 16. A group III or group V material may be formed on layer 16 or alternately on other layers that may be formed on layer 16. In an embodiment, a gallium nitride (GaN) layer 18 may be formed on buffer layer 16 and an AlGaN layer 19 may be formed on layer 18 or alternately on layer 16. An embodiment of layer 18 may not include dopant materials. Layer 18 may have an embodiment that has a width that is larger than a width of layer 19. An embodiment of layer 19 may be an undoped material, or alternately a doped material (with silicon for example), with a relatively thin width. Those skilled in the art will appreciate that other group III or group V materials may be used instead of GaN layer 18 and AlGaN layer 19. For example, materials such as various mole fractions of aluminum indium gallium (AlInGa), or other materials may be used.

The isolation structure may be formed in layer 19. An embodiment of the isolation structure may be an isolation region 37, illustrated by dashed lines, formed in a layer 19 and positioned adjacent a side of element 34 that is spaced away from node 32. In other embodiments, the isolation structure may be an isolation trench or other element that substantially prevents current flow from device 12 through the portion of a layer 18 or layer 19 that is on a side of element 34 that is opposite to node 32. Region 37 inhibits the formation of the 2-DEG where or near where region 37 is formed. In an embodiment, region 37 may be formed by implantation of nitrogen or boron or alternately formation of a trench which inhibits the formation of the 2-DEG. The formation of region 37 may be done at this stage in the steps of forming device 10 or alternately may be done at a later step such as after the step of removing portions of layers 20 and 24 which is explained in the description of FIGS. 4-5. Thus device 12 does not conduct current through any portion of layers 18 and/or 19 that is on the side of element 34 that is opposite to node 32. A gate material may be formed on layer 19. In an embodiment, a P-type gallium nitride (GaN) layer 20 may be formed on layer 19 as the gate material. An embodiment of layer 20 may be doped with Magnesium. In some embodiments, layer 20 may be P-type AlGaN, or a stack of materials that include one or more layers of P-type GaN, N-type GaN, n-type AlGaN, and P-type AlGaN.

Figure 4:
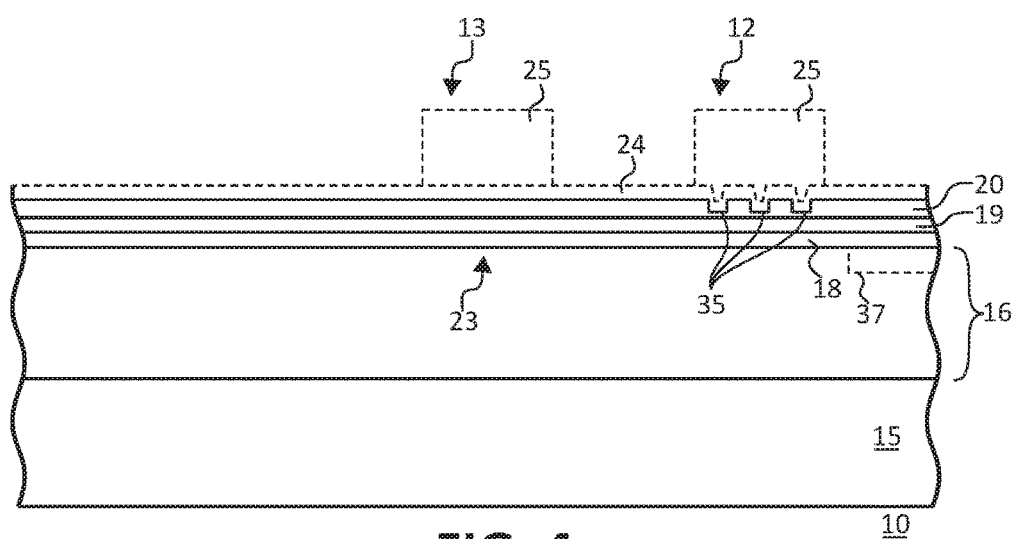
FIG. 4 illustrates a subsequent stage in an example of an embodiment of the method of forming the device of FIG. 1 in accordance with the present invention.
Figure 6:
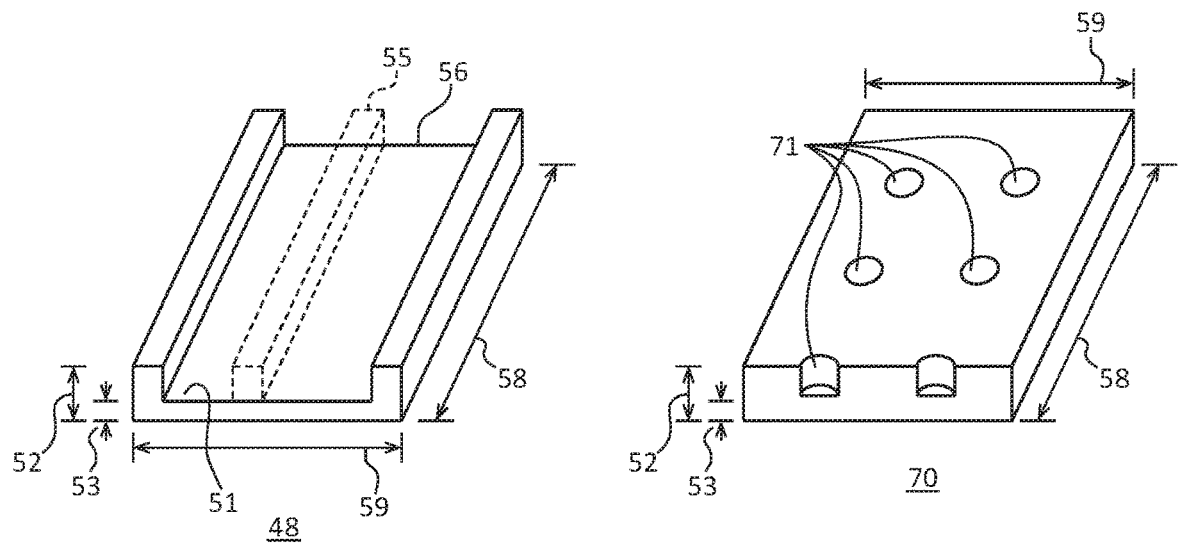
FIG. 6 illustrates an enlarged isometric view of an example of a portion of an embodiment of elements that each may have an embodiment that may be an alternate embodiment of one or more of the element of FIG. 1 in accordance with the present invention.

FIG. 4 illustrates device 10 at a subsequent stage in an example of an embodiment of the method of forming device 10. Recesses 35 are formed in a portion of layer 20 where device 12 is to be formed. For example, a mask may be patterned on layer 20 to expose a portion of layer 20 where recesses 35 are to be formed. Thereafter, the thickness of exposed portion of layer 20 may be reduced to form recesses 35 in layer 20 (FIG. 6). For example, layer 20 may be etched, or alternately selectively etched, to form recesses 35 in the exposed portion of layer 20. Thereafter, a conductor 24 may be formed on layer 20 including forming conductor 24 on layer 20 and on or in recesses 35. Conductor 24 is illustrated by dashed lines. In an embodiment, conductor 24 may be a layer of titanium nitride (TiN), but may be other conductors in other embodiments. For example, may be titanium, tantalum nitride, tantalum, or combination thereof. Subsequently, a mask 25 (illustrated by dashed lines) may be formed on conductor 24 and patterned to protect layer 20 and conductor 24 in the region where device 12 and a gate 23 of transistor 13 are to be formed.

Figure 5:
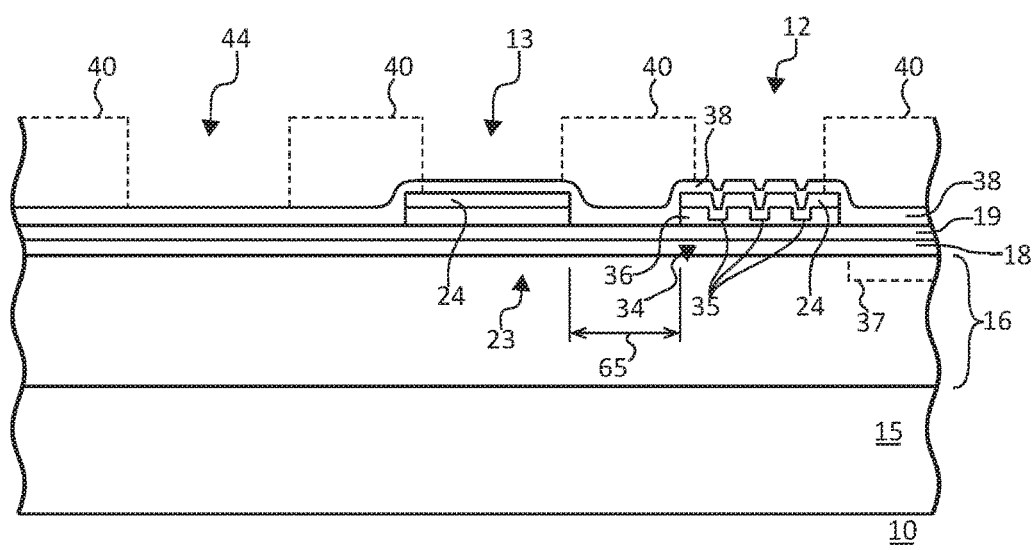
FIG. 5 illustrates another subsequent stage in an example of an embodiment of the method of forming the device of FIG. 1 in accordance with the present invention.

FIG. 5 illustrates another subsequent stage in an example of an embodiment of the method of forming device 10. After forming mask 25, the exposed portions of conductor 24 and layer 20 are removed. A portion of layer 20 and overlying conductor 24 remain to form gate 23. Another portion of layer 20 that includes recesses 35, along with overlying conductor 24, remain as a programmable element 34 of device 12. An embodiment of gate 23 may be formed to be spaced a distance 65 from element 34. For example, an edge of gate 23 that faces toward element 34 may be spaced distance 65 from an edge of element 34 that faces toward gate 23. The portion of element 34 formed by the material of layer 20 may be a gate material that is formed into an element 36 of element 34. As will be seen further hereinafter, element 36 may be replaced by elements 48 or 70 (FIG. 6). In an embodiment, an etchant may be used to etch the material of conductor 24 and layer 20 and to substantially inhibit etching when reaching layer 19. For example, layer 19 may function as a etch stop for the etching of conductor 24 and layer 20. Consequently, an embodiment of the non-recessed portions of element 36 have a thickness that is substantially the same as a thickness of the portion of layer 20 included within gate 23.

Thereafter, an insulator layer or insulator 38 may be formed at least on or overlying gate 23 and programmable element 34. In an embodiment, insulator 38 may be formed on all of layer 19 in addition to gate 23 and element 34. An embodiment of insulator 38 may be formed as a layer of silicon nitride (SiN) but may be other materials in other embodiments. For example, insulator 38 may be silicon dioxide, aluminum oxide, or combinations thereof.

Thereafter, a mask 40 (illustrated by dashed lines) may be formed overlying device 10 and patterned to have openings that expose at least a portion of layer 38 that is on element 34 and a portion that is on gate 23. Mask 40 may also have an opening to expose a portion of layer 38 in a region 44 where contact to layer 19 for a source of transistor 13 may be formed.

Referring back to FIG. 1 and to FIG. 5, the exposed portions of insulator 38 are removed. The removal exposes portions of gate 23, portions of element 34, and a portion of layer 19 in region 44.

Thereafter, an insulator 30 (FIG. 1) may be formed on device 10 and patterned to have an opening overlying at least a portion element 34 in order to expose at least some of element 34 that includes some of recesses 35, for example one or more of recesses 35. Other openings are also formed in layer 38 overlying at least a portion of gate 23, and the portion of layer 19 in region 44. A conductor material may then be applied to device 10 and patterned to leave a portion of the conductor material as a conductor 39 physically and electrically connected to element 34 and terminal 45, to leave another portion of the conductor material as a conductor 26 physically and electrically connected to gate 23 and terminal 43, and to leave yet another portion of the conductor material as a conductor 28 physically and electrically connected to layer 19 in region 44 and to terminal 42 to form an electrical connection between the source of transistor 13 and terminal 42. Conductors 26 and 28 form respectively a gate electrode and a source electrode of transistor 13. Conductor 39 forms a cathode electrode of diode 46. An embodiment of the conductor material may be a multilayer conductor such as for example a material that includes layers of titanium, aluminum, and titanium nitride (Ti/Al/TiN). Other conductor materials may be used in other embodiments.

The material of layers 18 and 19 form a two dimensional electron gas (2-DEG) as a channel layer as illustrated by dashed lines 21. Layer 20, layer 19, and layer 18 may be understood to form a PIN (P-type, intrinsic, N-type) diode structure with a depletion zone that extends over the channel layer. Because of the P-type GaN material of gate 23 and element 34, the 2-DEG is not formed underlying gate 23 and element 34, as illustrated by dashed lines 21. Additionally, the portion of the 2-DEG within layer 19 and to the right of gate 23, illustrated by a dashed box representing node 32, forms the drain of transistor 13. This region of layer 19 also conducts current 11 from element 34 into layer 19 to node 32. Thus, the drain region of transistor 13 also forms a connection to element 34, such as for example at node 32. The isolation structure, such as for example region 37, isolates element 34 from the portion of the 2-DEG that is within layer 19 and positioned to the right of element 34. Thus, device 12 does not conduct current to the right of element 34. In an embodiment, the unprogrammed condition of device 12 may be viewed as back-to-back diodes 46 and 47. In an embodiment, diode 46 may be formed at the interface of layer 24 and element 36, and diode 47 may be the PIN diode formed by layers 18-19 and element 36. In other embodiments, other materials may form a P-N diode instead of a PIN diode.

An embodiment may include that the thickness of element 36 underlying recesses 35 is less than the thickness of layer 20 of other portions of element 34. Alternately, the thickness of element 34 measured at the point of any of recesses 35 is less than the thickness of layer 20 of gate 23. The formation of device 10 results in forming element 34 spaced laterally apart from gate 23 and overlying a portion of the drain of transistor 13. The drain of transistor 13 is formed spaced laterally from gate 23. An embodiment may include that gate 23 is positioned laterally between element 34 and the source of transistor 13.

FIG. 6 illustrates an enlarged isometric view of an example of a portion of an embodiment of elements 48 and 70 that each may have an embodiment that may be an alternate embodiment of element 36. Thus, an embodiment of element 34 may include element 48 or element 70 instead of element 36. An embodiment of element 48 may be a portion of the material of layer 20 (FIG. 5) that has a recess 51 that extends into the material. An embodiment of recess 51 is substantially similar to at least one of recesses 35. Element 48 has a length 58 and a width 59. Element 48 may be formed to have one large recess 51 that is in a central portion of element 48 and extends along length 58. Element 48 may have a thickness 53 under recess 51. Non-recessed portions of element 48 may have a thickness 52 that is greater than thickness 53. Similarly, element 34 (FIG. 1) may have thickness 53 under recesses 35 and may have thickness 52 in the non-recessed portions of element 34. In an embodiment, thickness 52 is substantially the same as the thickness of the layer 20 portion of gate 23.

Other embodiments of element 48 may have a plurality of recesses 51 and 56 that are separated by non-recessed portions 55, illustrated by dashed lines. The recesses may be positioned between the outer sides of element 48. Portions 55 may extend length 58 down the length of element 48. In other embodiments, element 48 may have more than two recesses and more portions 55 that separate each recess from each other.

Element 70 may be a portion of the material of layer 20 (FIG. 5) that has recesses 71 formed to extend into the material. An embodiment of recesses 71 may by formed as openings that extend from the surface of element 70 a depth into element 70. The openings may have a circular shape or may have other shapes such as a parallelogram, a pentagon, a hexagon, an octagon, etc. The material of element 70 has thickness 53 underlying a bottom of recesses 71 and has thickness 52 in non-recessed portions. Element 70 also has length 58 and a width 59.

Figure 7:
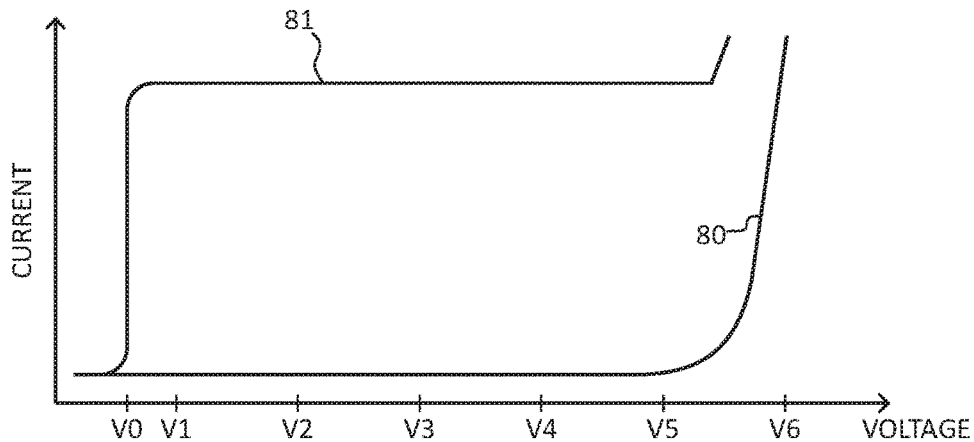
FIG. 7 is a graph having plots that illustrate some signals that may be formed by the device of FIG. 1 in accordance with the present invention.

FIG. 7 is a graph having plots that illustrate some signals that may be formed by device 12 (FIG. 1). The abscissa indicates voltage that is formed across element 34 such as from terminal 45 to node 32, and the ordinate illustrates increasing value of current 11. A plot 80 illustrates an embodiment of a V-I curve of an example of an embodiment of element 34 prior to being programmed, for example the unprogrammed condition, and during programming. A plot 81 illustrates an example of an embodiment of a V-I curve of an embodiment of element 34 after being programmed.

This description has references to FIGS. 1-2 and 6-7. Transistor 13 may be utilized to assist in programming device 12 to the programmed condition of being able to conduct current 11. This description refers primarily to element 34, or alternately element 36, and recesses 35, however, all such references include elements 48 and 70 and corresponding recesses 51 and 71. Referring to FIG. 7, assume element 34 is in the unprogrammed condition and that the forward breakdown voltage of element 34 (FIG. 1) is a voltage near voltage V6. To program element 34, element 34 is selectively connected to receive a voltage. As illustrated by plot 80, current 11 remains at a very low value as long as the voltage applied to terminal 45, or alternately across device 12, is less than the forward breakdown voltage of element 34. As the voltage increases to be no less than approximately the forward breakdown voltage (near V6), the value of current 11 increases to a large value.

In an embodiment, circuit 90 may be configured to selectively enable source 91 to apply the programming voltage Vp to device 12, and to selectively enable transistor 13 to allow current 11 to flow through device 12. For example, circuit 90 may apply a voltage Vg to the gate of transistor 13 to turn-on or enable transistor 13. Voltage Vg generally is greater than the gate-to-source turn-on threshold voltage of transistor 13 but less than the gate-to source breakdown voltage of transistor 13. Enabling transistor 13 causes the drain of transistor 13 be at substantially the CR voltage of terminal 42. Since transistor 13 is enabled, substantially the programming voltage (Vp) from source 91 is dropped across device 12, thus across element 34 including recesses 35. Source 91 may be configured to form the programming voltage Vp to be no less than the forward breakdown voltage of element 34 or alternately at least the forward breakdown voltage in the location of recesses 35. In an embodiment, voltage Vp may be no less than voltage Vg, and may be greater than Vg in some embodiments.

The reduced thickness of the material underlying recesses 35 lowers the forward breakdown voltage of element 34. For example, lowers the forward breakdown voltage across the material underlying recesses 35, thus, from terminal 45 to layer 19 or alternately from terminal 45 to node 32. The value of the programming voltage (Vp) is formed to cause element 34 to have a much greater internal electric field, at least within the material underlying recesses 35, which results in much lower forward breakdown voltage for element 34 than at thicker regions of device 12, for example, at the non-recessed portions of element 34 (FIG. 1). The programming voltage Vp causes the internal electric field in element 34 to increase which stresses the material of element 34, especially underlying recess 35, and damages the material of layer 20, especially underlying recess 35. The internal electric field across element 34 and recesses 35 creates defects in the material of layer 20 and forms a conduction path for current to flow through the material. It is believed that the internal electric field may cause formation of the defects starting at the surface of the material and then extending deeper into the material. This may be referred to as forming a percolation path. The defects are especially formed in the thinner portion of the material, such as underlying recesses 35. The material underlying recesses 35 breaks down and current 11 begins to increase as the voltage is increased to greater than the forward breakdown voltage. Thus, the forward breakdown voltage of elements 34 or 48 or 70 depends on thickness 53.

This method of formation defects in the material of device 12 is the opposite of the common semiconductor goals of reducing defects in the semiconductor material. The skilled artisan usually attempts to reduce defects, not form defects, in the semiconductor material in order to improve reliability, to improve yield of the devices, and to reduce costs.

Programming voltage Vp may also cause the 2-DEG (FIG. 1) to expand to underlie at least the thicker portions of element 34 which assists in forming current 11. Those skilled in the art will also appreciate that enabling the eHEMT embodiment of transistor 13 causes the 2-DEG to form underlying gate 23 so that current can flow through transistor 13.

After device 12 is programmed, the conduction path remains allowing current 11 to flow at a much lower applied voltage. For example, the defects may remain and form the conduction path for current to flow through element 34 to layer 19 allowing current 11 to flow from terminal 45 through the material of element 34 into layer 19 and to node 32. The thick portions of element 36 may still form diode 46, however, the conduction path is formed in parallel to diode 47 to short across diode 47 As will be seen further hereinafter (FIG. 9), after device 12 is programmed a voltage less than the programming voltage Vp will cause current 11 to flow through device 12.

Referring to plot 81 of FIG. 7, the current flow illustrated by plot 81 represents a programmed condition of device 12. After the programming voltage is removed, the damage and the conduction path remain to allow current 11 to flow through device 12, or alternately through element 34. After programming, current 11 begins to flow at a very low voltage applied across device 12, as illustrated by plot 81. Device 12 may have some resistance in the programmed condition, thus, may drop a small voltage across device 12. However, the voltage drop is much less than the programming voltage Vp or less than the voltage Vg. An embodiment may include that for an applied voltage less than voltage V6 (for example greater than VO and less than V6), the value of current 11 after programming is at least two orders of magnitude more than the value of current 11 prior to programming, and may be more than two orders of magnitude in some embodiments. The resistance of device 12 before programing is approximately two or more orders of magnitude more than the resistance after programming.

Figure 8:
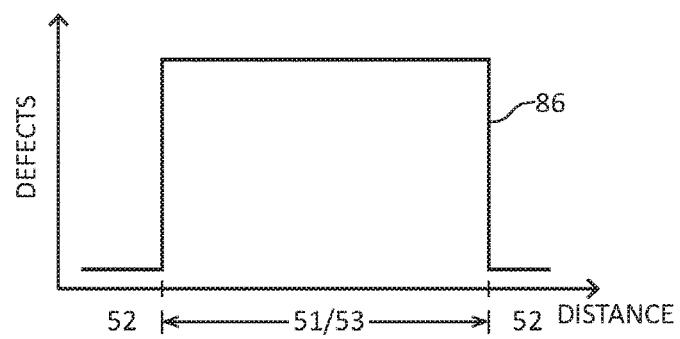
FIG. 8 is a graph having plots that illustrate an example of some characteristics of the device of FIG. 1 in accordance with the present invention.

FIG. 8 is a graph having a plot 86 that illustrate the relative number of defects across width 59 of element 48, or alternately elements 34 or 70, after forming the programmed condition. The abscissa indicates lateral distance across width 59 and the ordinate illustrates increasing number of defects. The labels on the abscissa indicates the regions of element 48 by the depth of the different portion thereof. As illustrated by plot 86, after forming the programmed condition of elements 34 or 48 or 70, the number of defects in the material under recesses 35 and/or 51 or 71 is greater than in the non-recessed portions. In an embodiment, it is believed that the number of defects underlying recess 35, or alternately 51 or 71, may be greater than at least approximately ten (10) times to approximately one hundred (100) times the number of defects in the non-recessed portions.

Figure 9:
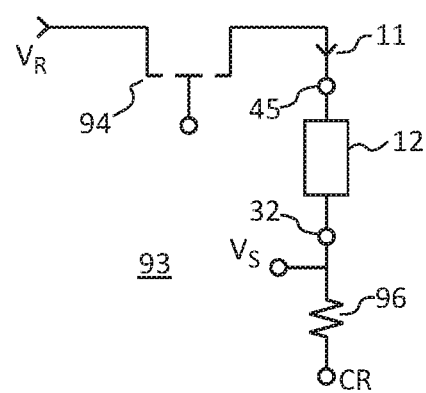
FIG. 9 schematically illustrates an example of a portion of an embodiment of a read-out circuit that may be used with the device of FIG. 1 in accordance with the present invention.

FIG. 9 schematically illustrates an example of a portion of an embodiment of a read-out circuit 93 that may be configured to determine the programmed or unprogrammed condition of device 12. Circuit 93 may include a read transistor 94 that may be configured to apply a read voltage (Vr) to device 12. Transistor 94 may have an embodiment that is an eHEMT. An embodiment of voltage Vr should be less than the programing voltage Vp. In an embodiment, the value of voltage Vr should be no less than the voltage at which the programmed condition of device 12 begins to conduct current 11. Referring to FIG. 7, Vr should be no less than the threshold voltage VO at which device 12 conducts current 11.

Applying the read voltage Vr to device 12 in the programed condition forms current 11 to flow through device 12. Circuit 93 may include a sense element 96 to sense current 11 flowing through device 12. In an embodiment, sense element 96 may be a series connected sense element, illustrated as a resistor but may be other well-known current sensing elements in other embodiments. The voltage formed by current 11 flowing through the sense element forms a sense voltage Vs. In the unprogrammed condition, current 11 would be substantially zero, except for unprogrammed leakage current as explained hereinbefore, in response to voltage Vr.

In one example embodiment, the forward breakdown voltage of device 12 or of element 34, or alternately elements 48 and/or 70, may be approximately six volts (6V) for a thickness 53 of approximately forty nano-meters (40 nm.). Thickness 52 in the non-recessed regions, and the thickness of layer 20 in gate 23, was approximately forty nano-meters (40 nm.). Thus, the programming voltage Vp is no less than the six volts. For such a configuration, a gate voltage of approximately five volts (5V) may be used to enable transistor 13. Thus, the programming voltage Vp may be greater than the gate-to-source threshold voltage of transistor 13 or alternately greater than the gate-to-source voltage Vg used to enable transistor 13. An example of the threshold voltage for the programmed condition of device 12, such as example voltage VO in FIG. 7, may be greater than one volt.

Another embodiment of elements 48 or 70, or alternately element 34, may have a thickness 53 of approximately eighty nano-meters (80 nm.) and a corresponding forward breakdown voltage of approximately twelve volts (12V). A gate voltage of approximately five volts (5V) may be used to enable transistor 13.

From all the foregoing, one skilled in the art will understand that an example of an embodiment of a GaN programming element may comprise:

an AlGaN layer, such as for example layer 19, overlying a semiconductor substrate;

a first P-type GaN material, such as for example element 36, on a first portion of the AlGaN layer, the first P-type GaN material having sides that have a first thickness, such as for example thickness 52, and having a recess formed in the first P-type GaN material, the recess positioned between the sides, the first P-type GaN material that is underlying the recess having a second thickness, such as for example thickness 53, that is less than the first thickness wherein a portion of the first P-type GaN material forms an anode of a GaN diode, such as for example diode 46;

a first conductor, such as for example conductor 24, physically contacting the first P-type GaN material that is underlying the recess; and a second P-type GaN material, such as for example gate 23, overlying a second portion of the AlGaN layer wherein the second P-type GaN material forms at least a portion of a gate of an eHEMT, such as for example transistor 13, the second P-type GaN material spaced a first distance, such as for example distance 65, from the first P-type GaN material wherein a third portion of the AlGaN layer, such as for example a part of the portion in box 32, positioned between the anode and the gate forms a drain of the eHEMT.

The GaN programming element may have an embodiment that may include that the first P-type GaN material that is underlying the recess has a conduction path therethrough and wherein the sides of first P-type GaN material do not have the conduction path.

An embodiment may include that the first P-type GaN material that is underlying the recess may have a first number of defects and that the sides of first P-type GaN material may have a second number of defects that is at least one order of magnitude less than the first number of defects.

An embodiment may also include a programming circuit configured to apply a voltage that is greater than forward breakdown voltage of the first P-type GaN material that is underlying the recess but less than a forward breakdown voltage of the sides of first P-type GaN material.

The GaN programming element may have an embodiment that may include that the first thickness is at least two times the second thickness.

An embodiment may include that the first P-type GaN material that is underlying the recess forms a portion of the anode of the GaN diode.

In an embodiment, the first conductor may form a cathode of the GaN diode.

An embodiment of a programmed state of the programming element may include that the first P-type GaN material forms a conduction path through the first P-type GaN material to the first portion of the AlGaN layer.

The first P-type GaN material may have an embodiment that may form an anode of a PIN diode, such as for example diode 47.

Those skilled in the art will appreciate that an example of an embodiment of a method of forming a III/V material programming element may comprise:

providing a first semiconductor layer, such as for example layer 19, from a group III or group V semiconductor material wherein the first semiconductor layer forms a 2DEG, such as for example 2-DEG 21, with an underlying second semiconductor layer, such as for example one or more of layers 18 and/or 16;

providing a P-type GaN layer, such as for example one or more of layers 20 and/or 36, on a first portion of the first semiconductor layer;

forming one or more recesses, such as for example recesses 35, in a first portion, such as for example a portion of layer 20, of the P-type GaN layer;

forming a first conductor, such as for example conductor 24, on the P-type GaN layer including forming the first conductor within the one or more recesses;

removing portions of the first conductor and the P-type GaN layer leaving the first portion of the P-type GaN layer and the first conductor within the one or more recesses, and also leaving a second portion of the P-type GaN layer and overlying portion of the first conductor as a gate, such as for example gate 23, of an eHEMT, the second portion of the P-type GaN layer spaced laterally apart, such as for example distance 65, from the first portion of the P-type GaN layer wherein a second portion, such as for example a part in box 32, of the first semiconductor layer that is positioned between the first portion of the P-type GaN layer and the second portion of the P-type GaN layer forms both a drain of the eHEMT and a portion of a diode, such as for example diode 47; and forming an inter-connect conductor, such as for example conductor 45, on the first conductor, within the one or more recesses.

The method may have an embodiment that may include forming the one or more recesses in the first portion of the P-type GaN layer includes removing portion of a material of the P-type GaN layer wherein the material underlying the one or more recesses has a thickness that is less that a thickness of the material external to the one or more recesses.

In an embodiment, the method may include selectively etching one or more areas of the first portion of the P-type GaN layer.

An embodiment may include forming the first portion of the P-type GaN layer as an anode of a GaN diode.

The method may also have an embodiment that may include configuring a circuit to form a voltage across the one or more recesses that is greater than a breakdown voltage of material of the p-type GaN layer that is underlying the one or more recesses and that is greater than a breakdown voltage of material of the p-type GaN Layer that is external to the one or more recesses.

One skilled in the art will appreciate that an example of an embodiment of a method of forming a programming element using a III/V semiconductor material may comprise:

providing a semiconductor substrate;

providing a first semiconductor layer, such as for example layer 19, from a group III or group V semiconductor material wherein the first semiconductor layer forms a 2DEG with an underlying second semiconductor layer, such as for example one or more of 18 and/or 16;

providing a gate material, such as for example one or more of layer 20 and/or element 36, on a first portion of the first semiconductor layer;

forming one or more recesses in a first portion of the gate material; and forming a first conductor on the first portion of the gate material including forming the first conductor on the one or more recesses.

The method may have an embodiment that may include forming at least a portion of the gate material as an anode electrode, such as for example element 34, of a diode.

An embodiment may include forming at least a portion of the gate material as a material of a programming element.

An embodiment of the method may include providing a first P-type GaN material, such as for example element 36, on a first portion of an underlying channel layer and forming the one or more recesses in a central region of the first P-type GaN material wherein the first P-type GaN material has a first thickness underlying the one or more recesses and the first P-type GaN material has a second thickness in material external to the one or more recesses wherein the second thickness is greater than the first thickness.

An embodiment may include providing a second P-type GaN material, such as for example a portion of gate 23, on a second portion of the underlying channel layer wherein the second P-type GaN material is spaced a first distance, such as for example distance 65, from the first P-type GaN material, the second P-type GaN material having a third thickness that is greater than the first thickness, forming a second conductor, such as for example conductor 24, on the second P-type GaN material.

The method may have an embodiment that may include forming the second P-type GaN material to have substantially the second thickness.

In view of all of the above, it is evident that a novel device and method is disclosed. Included, among other features, is forming a programmable device from group III or V materials. For example, from GaN material. Also included is forming recesses in the material to reduce the forward breakdown voltage of the material. Applying a programming voltage that is greater than the forward breakdown voltage forms a conduction path through the device, and the conduction path remains after the programming voltage is removed. The conduction path facilitates forming a current flow through the programming element at a much lower voltage.

While the subject matter of the descriptions are described with specific preferred embodiments and example embodiments, the foregoing drawings and descriptions thereof depict only typical and non-limiting examples of embodiments of the subject matter and are not therefore to be considered to be limiting of its scope, it is evident that many alternatives and variations will be apparent to those skilled in the art.

As the claims hereinafter reflect, inventive aspects may lie in less than all features of a single foregoing disclosed embodiment. Thus, the hereinafter expressed claims are hereby expressly incorporated into this Detailed Description of the Drawings, with each claim standing on its own as a separate embodiment of an invention. Furthermore, while some embodiments described herein include some but not other features included in other embodiments, combinations of features of different embodiments are meant to be within the scope of the invention, and form different embodiments, as would be understood by those skilled in the art.

The invention claimed is:

1. A GaN programming element comprising:
   an AlGaN layer overlying a semiconductor substrate;
   a first P-type GaN material on a first portion of the AlGaN layer, the first P-type GaN material having sides that have a first thickness and having a recess formed in the first P-type GaN material, the recess positioned between the sides, the first P-type GaN material that is underlying the recess having a second thickness that is less than the first thickness wherein a portion of the first P-type GaN material forms an anode of a GaN diode;
   a first conductor physically contacting the first P-type GaN material that is underlying the recess; and
   a second P-type GaN material overlying a second portion of the AlGaN layer wherein the second P-type GaN material forms at least a portion of a gate of an eHEMT, the second P-type GaN material spaced a first distance from the first P-type GaN material wherein a third portion of the AlGaN layer positioned between the anode and the gate forms a drain of the eHEMT.

2. The GaN programming element of claim 1 wherein the first P-type GaN material that is underlying the recess has a conduction path therethrough and wherein the sides of first P-type GaN material do not have the conduction path.

3. The GaN programming element of claim 1 wherein the first P-type GaN material that is underlying the recess has a first number of defects and wherein the sides of first P-type GaN material have a second number of defects that is at least one order of magnitude less than the first number of defects.

4. The GaN programming element of claim 1 further including a programming circuit configured to apply a voltage that is greater than forward breakdown voltage of the first P-type GaN material that is underlying the recess but less than a forward breakdown voltage of the sides of first P-type GaN material.

5. The GaN programming element of claim 1 wherein the first thickness is at least two times the second thickness.

6. The GaN programming element of claim 1 wherein an unprogrammed state of the programming element includes that the first P-type GaN material that is underlying the recess forms a portion of the anode of the GaN diode.

7. The GaN programming element of claim 6 wherein the first conductor forms a cathode of the GaN diode.

8. The GaN programming element of claim 1 wherein a programmed state of the programming element includes that the first P-type GaN material forms a conduction path through the first P-type GaN material to the first portion of the AlGaN layer.

9. The GaN programming element of claim 1 wherein the first P-type GaN material forms an anode of a PIN diode.

10. The GaN programming element of claim 1 wherein the first P-type GaN material includes a plurality of recesses positioned between the sides.

11. The GaN programming element of claim 1 wherein the GaN diode is connected in series with the drain.

12. The GaN programming element of claim 11 wherein the anode is connected to the drain.

13. The GaN programming element of claim 11 wherein the third portion of the AlGaN layer extends to connect the GaN diode to the drain.

14. The GaN programming element of claim 11 wherein a current path is formed through the first P-type GaN material to the drain and through the drain.

15. A programming element comprising:
   a first semiconductor layer of a group III or group V semiconductor material wherein the first semiconductor layer forms a 2DEG with an underlying second semiconductor layer;
   a first P-type GaN layer on a first portion of the first semiconductor layer, the first P-type GaN layer having a plurality of recesses in a first portion of the first P-type GaN layer;
   a first conductor on the first P-type GaN layer including within the plurality of recesses;
   a second P-type GaN layer on a second portion of the first semiconductor layer, the second P-type GaN layer spaced laterally apart from the first P-type GaN layer; and
   a third portion of the first semiconductor layer disposed between the first P-type GaN layer and the second P-type GaN layer and extending from the first portion of the first semiconductor layer toward the second portion of the first semiconductor layer wherein the third portion of the first semiconductor layer forms both a portion of a drain of an eHEMT and a current flow path from the drain to the first P-type GaN layer.

16. The programming element of claim 15 wherein the first P-type GaN layer forms a current path through the first P-type GaN layer to the third portion of the first semiconductor layer.

17. The programming element of claim 15 wherein the first P-type GaN layer forms an anode of a diode.

18. A programming element comprising:
   a semiconductor substrate;
   a first semiconductor layer of a group III or group V semiconductor material;
   a second semiconductor layer underlying the first semiconductor layer wherein the first semiconductor layer and the second semiconductor layer form a 2DEG;
   a first gate material overlying a first portion of the first semiconductor layer, the first gate material having one or more recesses in a first portion of the first gate material;
   a first conductor on the first portion of the first gate material including on the one or more recesses;
   a second gate material overlying a second portion of the first semiconductor layer wherein the second gate material is spaced laterally apart from the first gate material; and
   a third portion of the first semiconductor layer extending from first portion of the first semiconductor layer to form a current path from the first conductor to the second portion of the first semiconductor layer.

19. The programming element of claim 18 wherein the third portion of the first semiconductor layer extends coextensively between the first portion of the first semiconductor layer and the second portion of the first semiconductor layer.

20. The programming element of claim 18 wherein the first gate material has a plurality of recesses.

* * * * *